(12) United States Patent
Saito et al.

(10) Patent No.: US 7,202,150 B2
(45) Date of Patent: Apr. 10, 2007

(54) SEMICONDUCTOR MEMORY DEVICE AND MANUFACTURING METHOD THEREFOR

(75) Inventors: Kenji Saito, Kanagawa (JP); Hiroshi Furuta, Kanagawa (JP)

(73) Assignee: NEC Electronics Corporation, Kawasaki (JP)

(*) Notice: Subject to any disclaimer, the term of this patent is extended or adjusted under 35 U.S.C. 154(b) by 134 days.

(21) Appl. No.: 11/155,849

(22) Filed: Jun. 17, 2005

(65) Prior Publication Data

US 2005/0230748 A1  Oct. 20, 2005

Related U.S. Application Data

(62) Division of application No. 10/414,720, filed on Apr. 16, 2003, now Pat. No. 6,936,891.

(30) Foreign Application Priority Data

Apr. 18, 2002  (JP) ............................. 2002-116142

(51) Int. Cl.
*H01L 21/3205* (2006.01)

(52) U.S. Cl. ............... 438/588; 438/216; 438/261; 438/587; 438/591; 257/E21.679

(58) Field of Classification Search ............... 438/216, 438/261, 587, 588, 591, 593; 257/E21.679
See application file for complete search history.

(56) References Cited

U.S. PATENT DOCUMENTS

| 5,745,007 A | 4/1998 | Redman-White |
| 5,768,192 A | 6/1998 | Eitan |
| 5,985,718 A | 11/1999 | Dalla Libera et al. |
| 6,181,597 B1 | 1/2001 | Nachumovsky |
| 6,269,023 B1 | 7/2001 | Derhacobian et al. |
| 6,344,394 B1* | 2/2002 | Kaneoka ............... 438/261 |
| 6,346,442 B1 | 2/2002 | Aloni et al. |
| 6,380,582 B2* | 4/2002 | Camerlenghi et al. ...... 257/314 |
| 2003/0082871 A1 | 5/2003 | Harari et al. |

FOREIGN PATENT DOCUMENTS

| JP | 64-073761 | 3/1989 |
| JP | 2001-512290 | 8/2001 |
| WO | WO 99/07000 | 2/1999 |

* cited by examiner

*Primary Examiner*—Andy Huynh
(74) *Attorney, Agent, or Firm*—Katten Muchin Rosenman LLP

(57) ABSTRACT

A semiconductor memory device, adapted for storing plural bits per cell to be able to accomplish high storage density by a simplified structure, includes a plurality of first gate electrodes extending parallel to one another along one direction and a plurality of second gate electrodes extending in a direction of intersecting the first gate electrodes, in which a diffusion region is provided on each of a plurality of divisions demarcated in a matrix-like pattern by first and second electrodes on a substrate surface. One of the divisions, the four sides of which are defined by two neighboring first gate electrodes and two neighboring second gate electrodes, has four independently accessible bits, and is connected by a contact (CT) with a diffusion region in the division. There are provided a plurality of interconnections connected via contacts to the diffusion regions of other divisions in the plural matrix-like divisions lying on the line of extension of the aforementioned diagonal line. A plurality of the aforementioned interconnections are arranged for extending parallel to one another in the memory cell array in an oblique direction relative to the lattice of the first and second electrodes.

9 Claims, 18 Drawing Sheets

CROSS-SECTION B-B'

CROSS-SECTION ALONG A-A'

CROSS-SECTION B-B'

CROSS-SECTION C-C'

CROSS-SECTION D-D'

SEMICONDUCTOR MEMORY DEVICE AND MANUFACTURING METHOD THEREFOR

CROSS-REFERENCE TO RELATED APPLICATION

This application is a divisional of U.S. patent application Ser. No. 10/414,720, filed on Apr. 16, 2003, now Pat. No. 6,936,891, and claims priority from Japanese Patent Application number 2002-116142 filed on Apr. 18, 2002, the contents of which are herein wholly incorporated by reference.

FIELD OF THE INVENTION

The present invention relates generally to a semiconductor memory device and a manufacturing method therefor. More particularly, the invention relates to a semiconductor memory device for storing plural bit of information per cell, and a manufacturing method therefor.

BACKGROUND OF THE INVENTION

As the techniques relevant to the present invention, reference is made to the following publications:
(1) JP Patent Kokai Publication JP-A-64-73761
(2) U.S. Pat. No. 6,269,023 B1
(3) U.S. Pat. No. 5,768,192
(4) U.S. Pat. No. 6,181,597 B1 and
(5) JP Patent Kohyo Publication JP-P2001-512290A.

A nonvolatile memory of the MONOS (metal-oxide-silicon) structure, having a dielectric film, called an ONO (oxide nitride oxide film), obtained on layering first a silicon dioxide layer, then layering a silicon nitride film on a silicon dioxide layer and then layering a silicon dioxide layer of silicon nitride film to form a gate insulating film, has been commercialized to take the place of a nonvolatile memory which has a two-layered gate structure comprised of a control gate and a floating gate. The nonvolatile memory of the MONOS structure is able to store data in a charge trapping layer, which is sandwiched between silicon dioxide layers directly below the gate electrode, at two bits per cell. As for details of the writing, reading and erasure of memory cells of an EEPROM (electrically erasable and programmable ROM), having a charge trapping layer and having a storage node of two bits per cell, reference is had to for example the description of the Publication (5). In the Publication (2), there is disclosed a structure having a limiter for limiting the number of hot carriers flowing into the channel in the nonvolatile memory having an ONO film for trapping the electrical charges in a charge trapping area.

The conventional nonvolatile memory cell, having an ONO layer as a gate insulating film, is explained with reference to FIG. 18. FIG. 18 is based on the description of FIG. 2 of the Publication (5), and shows the cross-section of an EEPROM memory cell of the ONO structure. The memory cell includes a gate structure comprised of an electrically non-conductive dielectric film 220, having a charge trapping function, sandwiched between two silicon dioxide layers 218 and 222. These two silicon dioxide layers 218 and 222 operate as insulating films. An electrically conductive gate film 224 is formed over the upper silicon dioxide layer 222. Two separate bits, that is a left side bit 221 and a right side bit 223, are formed in areas of the charge trapping layer 220 spaced apart from each other. The two bits (storage nodes) are read in the opposite direction from the direction in which they were programmed. For example, the right-side bit 223 in the charge trapping layer 220 is programmed by applying a positive program(write) voltage to the gate electrode 224 and to a drain (N+diffusion region) 216 to ground the source (N+diffusion region) 214 to cause sufficiently accelerated hot electrons to be injected into a region adjacent to the drain 216 of the charge trapping layer. The reading of stored bits is done by applying the positive voltage to the gate electrode 224 and to the source 214 and by grounding the drain 216, that is in a direction opposite to that for the programming. The programming and reading of the left-side bit 221 are the same as those for the right side bit 223 except that the source and the drain are interchanged with each other as to their respective functions. For erasing the memory cell, an appropriate erasure voltage is applied to the gate electrode 224. For erasing the right-side bit 223 or the left-side bit 221, an erasure voltage is applied to the drain 216 or to the source 214, respectively, to expel the electrons from the charge-trapping layer. By setting the gate voltage and the voltages for the drain and the source, in this manner, two bits may be stored independently on the left and right sides of the charge-trapping layer 220 directly below the gate electrode.

A typical layout of the non-volatile memory of the NOMOS structure is shown in the Publication (4). The layout of this Publication (4) is not fitted to the high integration level (density) because one contact is needed for a two-bit storage node. On the other hand, the Publication (1) shows an EEPROM (electrically programmable ROM) having two polycrystalline silicon(commonly known as polysilicon) layers arranged in a lattice-like pattern. This EEPROM includes a first group of word lines, a second group of word lines, arranged in a spatially intersecting relationship thereto, and a group of bit lines, arranged on the surfaces of the first and second groups of the word lines, in an oblique direction, extending through the surface of the region of the spatial intersection, with the interposition of an interlayer insulating film, and which are connected common to the source and drain regions extending in the oblique direction of the group of the memory cell transistors through vias of the interlayer insulating film. The memory device described in this Publication (1) has a one-bit storage node per gate and is of the double-layer polysilicon gate structure, and hence the manufacturing method of the memory device becomes complicated.

SUMMARY OF THE DISCLOSURE

The above-described memory device of the conventional MONOS structure may not be said to be suitable for high integration because one-half contact is needed per one bit of the storage node.

Accordingly, it is an object of the present invention to provide a semiconductor memory device which stores plural bits per cell and which enables high recording density by a simplified structure.

It is another object of the present invention to provide a method for producing a semiconductor memory device which stores plural bits per cell to enable high density to facilitate the manufacture.

The above and other objects are attained by a semiconductor memory device in accordance with one aspect of the present invention, which includes a plurality of first gate electrodes extending parallel to one another along a first direction in a memory cell array area on a substrate and a plurality of second gate electrodes extending parallel to one another along a second direction in a configuration of intersecting the first gate electrodes, wherein a diffusion region is provided in a substrate surface of each of a plurality of areas, herein termed divisions, determined by the plural first gate electrodes and by the plural second gate electrodes in the memory cell area in a matrix configuration, wherein each cell having the first gate electrodes and the second gate electrodes as a gate structure has two storage nodes in an insulating film below the gate electrodes, the storage nodes being spatially spaced apart in association with the diffusion regions of two of the divisions lying on both sides of the gate electrodes, and wherein each division having four sides demarcated by the two neighboring first gate electrodes and by the two neighboring second gate electrodes has storage nodes of independently accessible four bits.

According to the present invention, a plurality of interconnections, connected via contacts to the diffusion regions of the divisions, and extending obliquely relative to the lattice composed by the first gate electrodes and the second gate electrodes, are arranged parallel to one another in the memory cell area. These interconnections are connected via contacts to the diffusion regions of the plural divisions lying directly below the interconnections extending obliquely in the plural matrix-like divisions.

A manufacturing method in another aspect of the present invention includes (a) a step of depositing a first gate insulating film, including a charge trapping layer on a substrate, then depositing a first electrically conductive film on a first gate insulating film, and then depositing an insulating film on said first electrically conductive film, to form a stripe-shaped first gate electrode structure, (b) a step of depositing a second gate insulating film on the substrate, including a charge trapping layer, and then depositing a second electrically conductive film on said second gate insulating film, so as to leave the insulating film which covers the first gate electrode, and so as to form a second gate electrode structure extending in a striped pattern in a direction perpendicular to the direction of extension of the first gate electrode, (c) a step of implanting impurity ions to form an impurity diffusion region on a portion of the substrate surface where there lack the first and second electrically conductive films, (d) a step of forming an interlayer insulating film(inter-layer dielectrics) for forming a contact for electrical connection to the impurity diffusion region, and (e) a step of forming an electrically conductive interconnection, connecting to the diffusion region via the contact, on the inter-layer insulating film. As will be apparent from the following description, the above objects of the present invention may also be solved by the respective claims and sub-claims.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

The present invention is now explained with reference to the embodiments. The present invention includes a plurality of first gate electrodes (105) extending parallel to one another along a first direction in a memory cell array area on a substrate and a plurality of second gate electrodes (109) extending parallel to one another along a second direction in a configuration of intersecting the first gate electrodes. A diffusion region is provided on a substrate surface of each of a plurality of areas, herein termed divisions, demarcated by the plural first gate electrodes and by the plural second gate electrodes in the memory cell area in a matrix configuration.

Each cell transistor which has the first gate electrodes and the second gate electrodes as a gate structure, includes two storage nodes (L and R) in an insulating film below the gate electrodes. The two storage nodes (L and R) are spatially spaced apart in association with the diffusion region of two of the divisions lying on both sides of the gate electrode.

Figure 2:
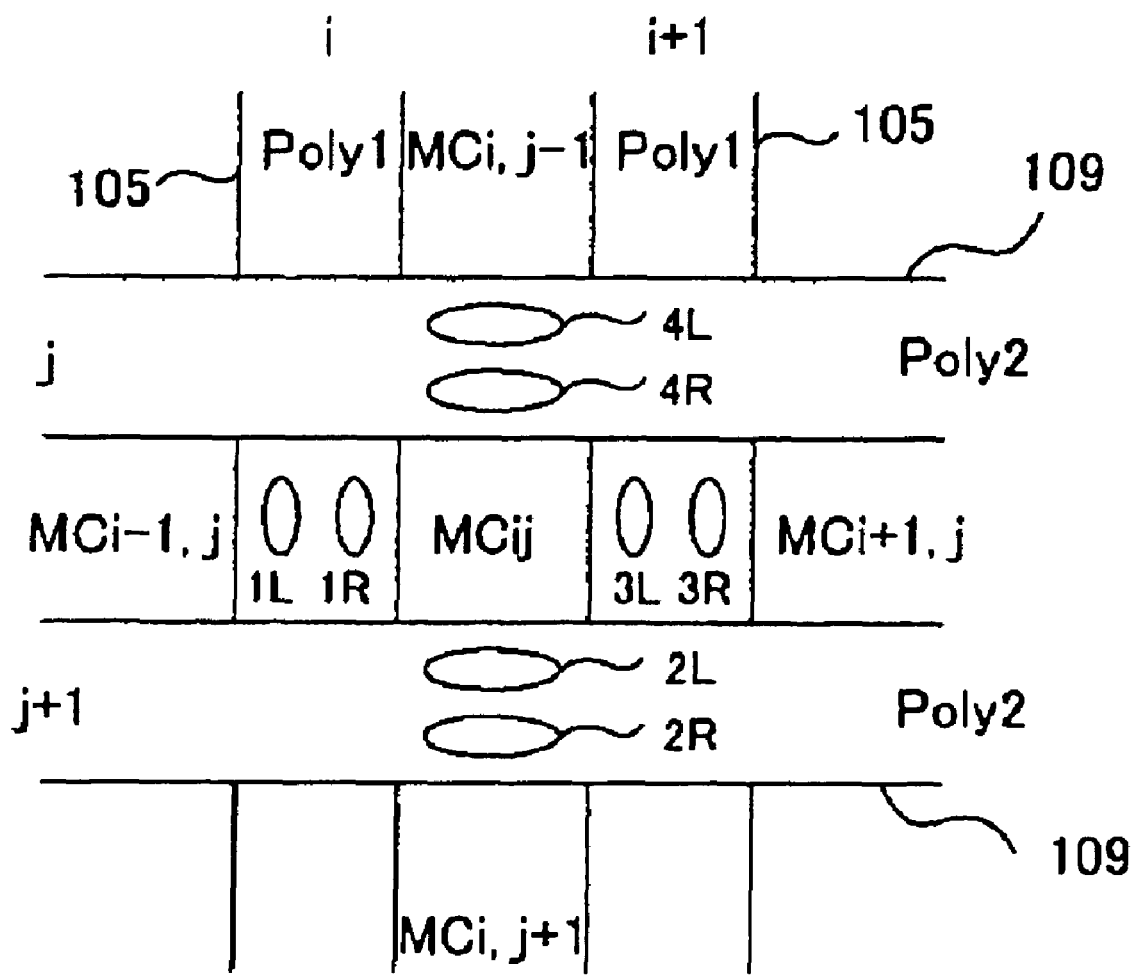
FIG. 2 illustrates the structure of an embodiment of the present invention.

Each division having four sides demarcated by the two neighboring first gate electrodes (105) and by the two neighboring second gate electrodes (109) has storage nodes of independently accessible four bits. That is, there are provided independently accessible 4 bit storage nodes per cell transistor on four sides of 1R, 2L, 3L and 4R as indicated at $MC_{i,j}$ in FIG. 2 schematically showing the peripheral portions of a given transistor to an enlarged scale.

According to the present invention, a plurality of interconnections (112), each of which is connected via a contact (CT) to a diffusion region of one division, and is extended obliquely relative to the lattice composed by the first gate electrodes (105) and the second gate electrodes (109), are arranged parallel to one another in the memory cell area. The interconnection (112) are connected via contacts (CT) to the regions of the plural divisions, lying directly below the interconnection extending obliquely in the plural matrix-like divisions.

According to the present invention, the plural first gate electrodes (105) form a first set of the word lines, whilst the second plural gate electrodes (109) form the second set of the word lines, with the interconnections (112) forming the bit lines.

In an embodiment of the present invention, in the peripheral portion of the memory cell array area, there are following layout configurations of divisions located along the longitudinal direction of the interconnections. The diffusion region in a division which has respective two sides demarcated by one first gate electrode (such as W13 of FIG. 7) and one second gate electrode (such as WQ1 of FIG. 7), may be connected to the interconnection (metal 1) via a contact. The diffusion region in another division which has respective three sides demarcated by one first gate electrode (such as W13 of FIG. 7) and two neighboring second gate electrodes (such as WQ1 and WQ2 of FIG. 7), may be connected to the interconnection via a contact, or the diffusion region in the division which has respective three sides demarcated by two neighboring first gate electrodes (such as W1 and W2 of FIG. 7) and one second gate electrode (such as WQ1 of FIG. 7) may be connected to the interconnections via a contact.

According to an embodiment of the present invention, plural interconnections (metal 1 of FIG. 7) are arranged obliquely parallel to one another in a rectangular memory cell array area. One of the plural interconnections is arranged linearly from one division (such as P1 of FIG. 7) towards an upper end in the rectangular area of the memory cell array to a division (such as P2 of FIG. 7) at a lower end on the opposite side. The other interconnections are arranged parallel to the above-mentioned interconnection and to each other. The respective interconnections are connected via contacts CT to the diffusion regions of the plural divisions located below the interconnection.

In an embodiment of the present invention, the interconnection is arranged in accordance with a skipping pattern of skipping plural rows per one column (corresponding to "keima-skipping pattern" in Japanese chess game) and is connected via respective contacts to the diffusion regions of the divisions located at the column and at the row corresponding to the skipping sequence.

In a further embodiment of the present invention, a plurality of upper layer interconnections (metal 2 of FIGS. 8 and 10), pass over the plural interconnections (metal 1 of FIGS. 8 and 10) and extend parallel to one another along the direction of a straight line which is determined by a division of one row of one side end in a rectangular region of the memory cell array to a division of another row of the opposite side end. The upper layer interconnections (metal 2) has one end connected to a corresponding lower layer interconnection (metal 1) via a through-hole in one division of one side end of the memory cell array, and the opposite end connected to a corresponding lower layer interconnection (metal 1) via a through-hole in one division of the opposite side end of the memory cell array. The lower layer interconnection (metal 1) is connected to the diffusion region via contact (CT) in the division (see directly upper CT-TH of FIG. 10).

According to the present invention, the gate insulating film of each of the first gate electrodes and the second gate electrodes is composed of stacked layers which includes a silicon dioxide layer and a charge trapping layer. The charge-trapping layer is preferably formed by a silicon nitride film. Alternatively, it may be formed by a silicon dioxide layer doped with impurities.

According to the present invention, the width of the gate electrode, interval of the gate electrodes and the film thickness of the gate insulating film are set to equal values, from one cell transistor to another, in order that the ability of the cell transistor including the first gate electrode will be equivalent to the ability of the cell transistor including the second gate electrode. This assures equal values of the read current at the time of reading the memory cells from one gate electrode to another.

According to the present invention, the second gate electrode (109) is arranged as an upper layer of the second gate electrode at an intersection thereof with the first gate electrode (105). In the intersection of the second gate electrode with the first gate electrode (105), the second gate electrode (109) is arranged to lie above the first gate electrode (105), along with the gate insulating film, arranged directly below the second gate electrode. In an area other than the intersections, the second gate electrode (109), arranged on the substrate surface via gate insulating film, has an electrical resistance equal to or smaller than the electrical resistance of the first gate electrode.

In an embodiment of the present invention, a region containing impurities of an opposite conductivity type to that of the diffusion region to a concentration higher than the concentration of substrate impurities is provided directly below and in the vicinity of an intersection of the first gate electrode (105) with the second gate electrode (109), the region being a device isolation region.

Figure 14:
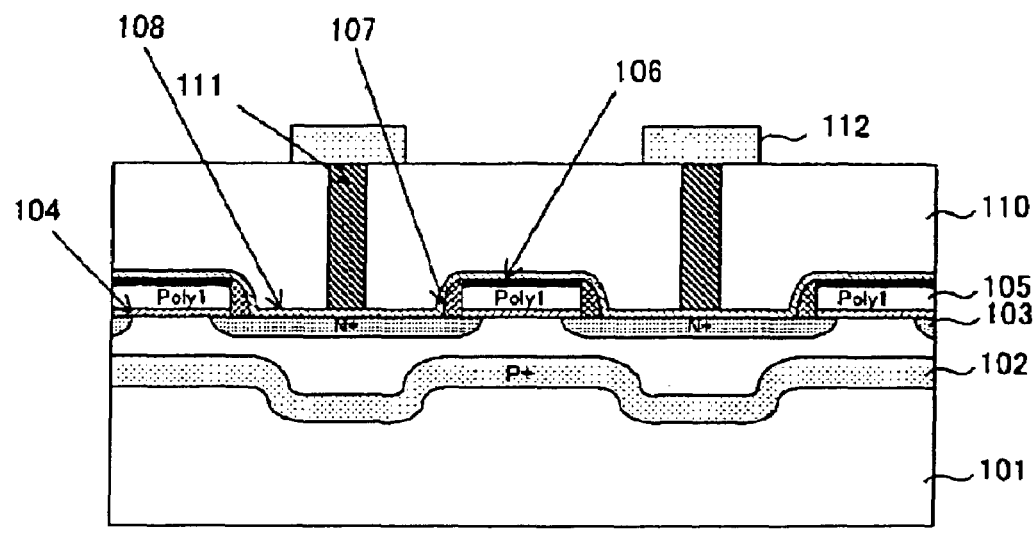
FIG. 14 illustrates a manufacturing method of another embodiment of the present invention.
Figure 15:
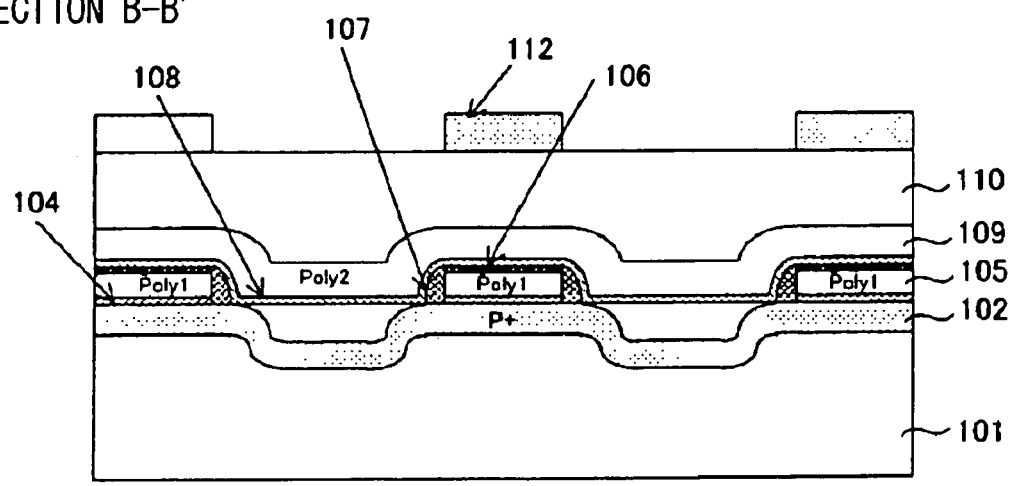
FIG. 15 illustrates a manufacturing method of an embodiment of the present invention.
Figure 16:
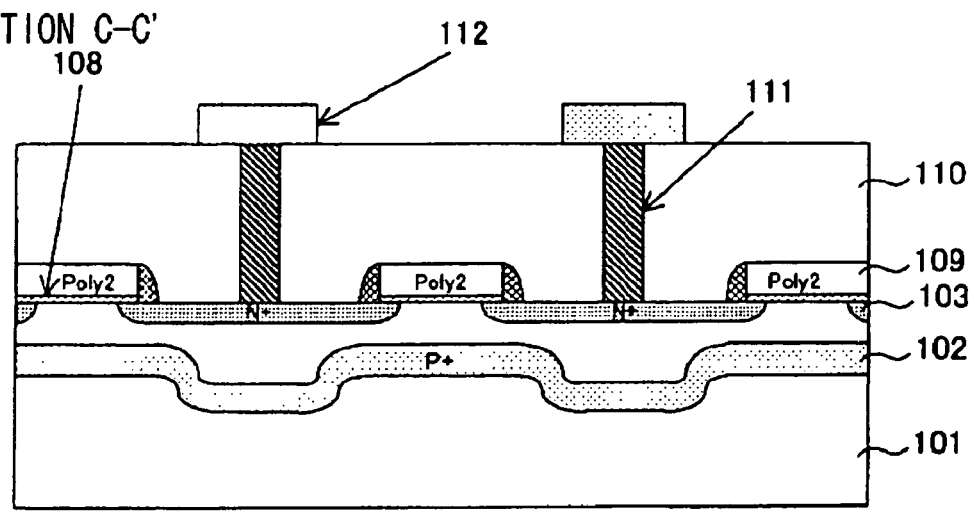
FIG. 16 illustrates a manufacturing method of another embodiment of the present invention.
Figure 17:
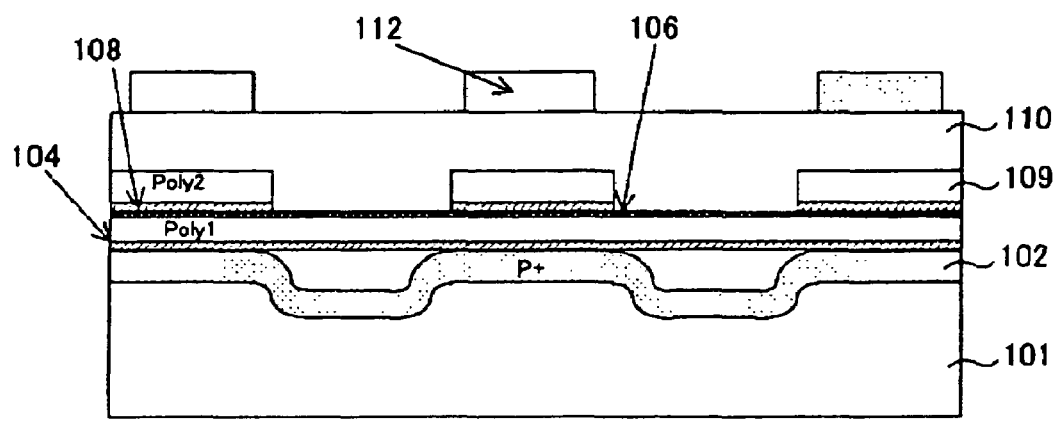
FIG. 17 illustrates a manufacturing method of an embodiment of the present invention.

In another embodiment of the present invention, a region (102 of FIGS. 14 to 16) containing impurities of an opposite conductivity type to that of the diffusion region to a concentration higher than the concentration of the substrate impurities is provided on a substrate surface directly below an intersection between the first gate electrode (105 of FIGS. 14 to 16) and the second gate electrode (109 of FIGS. 14 to 16) and in a deeper region in the bulk of a substrate below the diffusion region and the channel region. This region (102) functions as a device isolation region.

Figure 6:
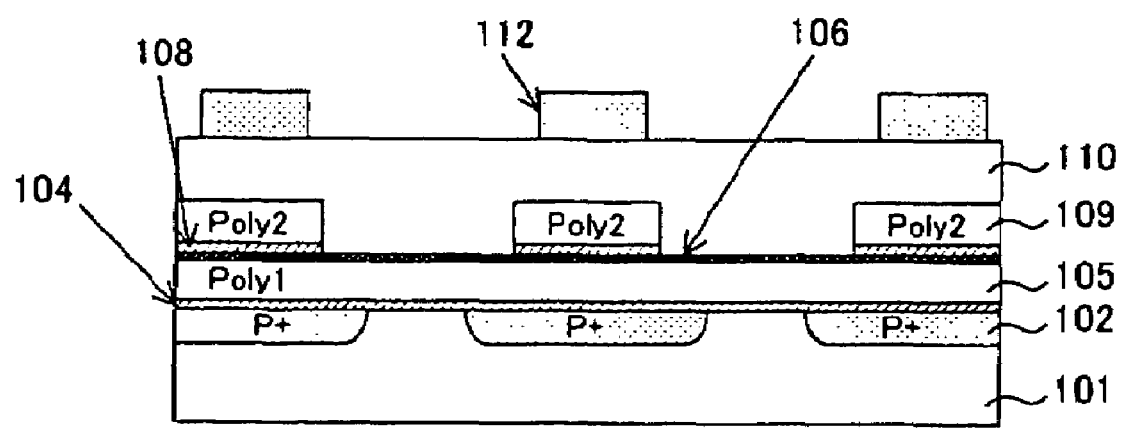
FIG. 6 schematically shows the cross-section taken along line D—D of FIG. 1.

In an embodiment of the present invention, an insulating film (106 of FIG. 6) is provided above the first gate electrode (105 of FIG. 6). On this insulating film (106), a second gate insulating film (108 of FIG. 6) is provided, and a second gate electrode (109 of FIG. 6) is provided above the second gate insulating film (108 of FIG. 6).

Figure 4:
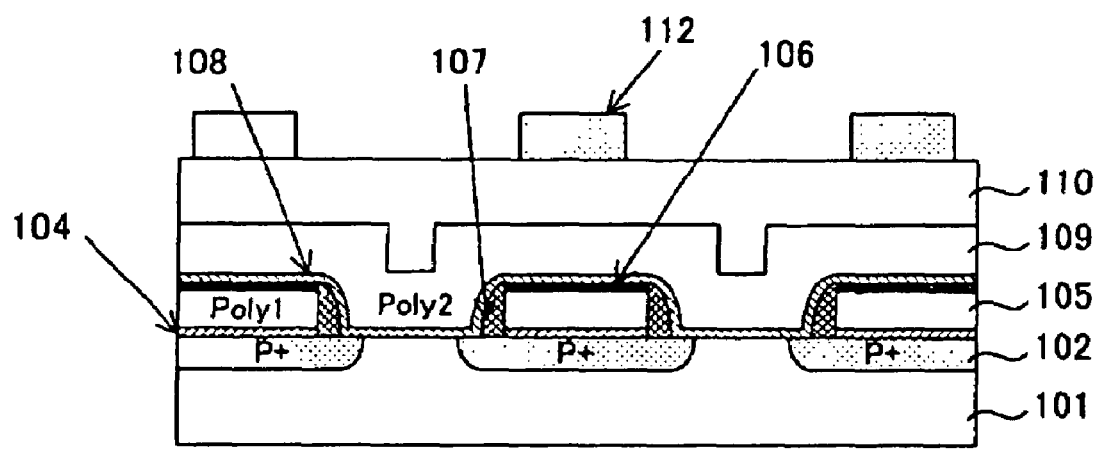
FIG. 4 schematically shows the cross-section taken along line B—B of FIG. 1.

In an embodiment of the present invention, sidewalls (107 of FIG. 4) formed by an insulating film are provided on both sides of the first gate electrode (105), along the longitudinal direction of the second gate electrode in an area of intersection of the first gate electrode (105 of FIG. 4) and the second gate electrode (109 of FIG. 4). The second gate insulating film (108) and the second gate electrode (109) are provided at the intersection therof with the first gate electrode (105) for overlying the insulating film (106) and the sidewall (107).

In an embodiment of the present invention, the interconnection (112 of FIG. 1) forming a bit line is connected to the diffusion region of one division at a contact (CT).

In an embodiment of the present invention, a first X decoder and a second X decoder, which decode a row address, selecting a word line selected from a first group of word lines and a second group of word lines, and for driving the selected word line, are provided on a first side and a second side of the four sides of a rectangular area of the memory cell array neighboring to each other. A first Y switch selection circuit and a second Y switch selection circuit (Y decoders) (14 and 15 of FIG. 11C)are provided in association with bit lines drawn out from a third side and a fourth side of four sides of the rectangular area of the memory cell array (11 of Fig. 11C) neighboring to each other for decoding a column address, turning on a Y switch of the selected bit line and for connecting the Y switch of the selected bit line to a sense amplifier. In another embodiment of the present invention, the interconnection (metal 1 of FIG. 9) may be turned up via an upper layer interconnection (metal 2 of FIG. 9), and a Y switch selection circuit (14 of FIG. 11B) may be provided which decoded the column address to turn on the Y switch of the selected bit line to connect the selected bit line to the sense amplifier in association with the bit line drawn out from the third side of the four sides of the rectangular area of the memory cell array.

In an embodiment of the present invention, the number of cells connected to the first gate electrode and that connected to the second gate electrode in the memory cell array, are equal to each other. Alternatively, the number of cells connected to the first gate electrode may be set so as to be smaller than that connected to the second gate electrode in the memory cell array. The length ratio of the first gate electrode (105) to the second gate electrode (109) may also be set to a preset value other than 1:1 depending on, for example, the size of he memory cell array, shape of the diffusion region, or the arrangement of the bit lines, such as keima skip. The driver circuits of the X decoders respectively driving the first gate electrode (105) and the second gate electrode (109) (word line drivers) are set to the driving capability determined in accordance with the lengths of the first and second gate electrodes and on the number of the connected cells. This enables the difference in the length or load in the first gate electrode (105) and in the second gate electrode (109) to drive the respective gate electrodes evenly.

The manufacturing method according to the present invention includes a step of forming a silicon dioxide layer on a substrate, then forming a charge trapping layer on the silicon dioxide layer and then forming a silicon dioxide layer on the charge trapping layer to form a first gate insulating film, on the entire substrate surface, a step of depositing a first electrically conductive film (105) and then an insulating oxide film (106) on the first electrically conductive film, on the entire substrate surface, to form a stripe-shaped first gate electrode structure, a step of forming an oxide film on the entire substrate surface and forming by etchback a sidewall (107) on the lateral side of the first gate electrode, a step of forming a silicon dioxide layer on a substrate, then forming a charge trapping layer on the silicon dioxide layer and then forming a silicon dioxide layer on the charge trapping layer to form a second gate insulating film on the entire substrate surface, a step of depositing a second electrically conductive film (109) on the entire substrate surface and forming a stripe-shaped second gate electrode structure extending in a direction perpendicular to the direction of extension of the first gate electrode and a step of implanting impurity ions for forming an impurity diffusion region (103) on a portion of the substrate surface devoid of the first and second electrically conductive films. The manufacturing method may also include a step of forming, after forming the interlayer insulating film (110), a contact (111) for electrically connecting to the impurity diffusion region (103), and a step of forming, on the interlayer insulating film, an electrically conductive interconnection (112), connecting via the contact to the diffusion region, for extending obliquely relative to the lattice composed by the first and second electrically conductive films. If necessary, the portion of the sidewall of the first gate electrode, not covered by the first and second electrically conductive films, may be removed before implanting impurity ions to the entire surface.

Figure 1:
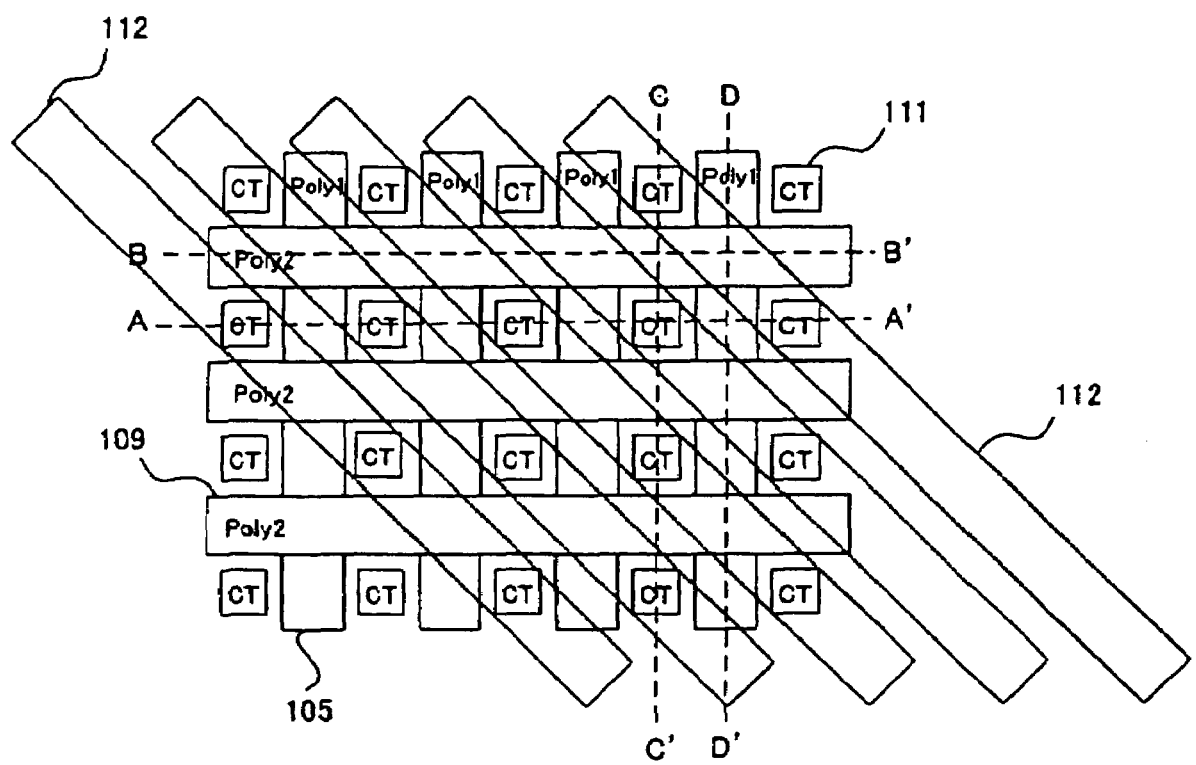
FIG. 1 illustrates the layout structure of an embodiment of the present invention.

Referring to the drawings, an embodiment of the present invention is now explained in detail. FIG. 1 shows a schematic plan view showing a layout structure of a memory cell array in a semiconductor memory device according to an embodiment of the present invention.

Referring to FIG. 1, a semiconductor memory device of the present embodiment includes a plurality of first polysilicon (poly 1) layers 105, extending parallel to one another in a first direction in a memory cell array area on a substrate, and a plurality of second polysilicon (poly 2) layers 109 extending parallel to one another in a second direction perpendicular to the first direction for intersecting the first polysilicon (poly 1) layers 105. These first and second polysilicon gates 105 and 109 compose word lines. In each of plural matrix-like areas (termed a division), demarcated by the first polysilicon (poly 1) layers 105 and the second polysilicon (poly 2) layers 109, arranged in a lattice pattern, there is formed a diffusion region in the substrate surface. A plurality of metal interconnections (metal 1), forming bit lines, are formed in parallel to one another for extending in an oblique direction to the lattice formed by the first polysilicon (poly 1) layers 105 and the second polysilicon (poly 2) layers 109. The metal interconnections 112 are connected via contacts 111 with the diffusion regions of the plural divisions directly below the metal interconnections 112. A charge trapping layer, such as a film of silicon nitride, sandwiched between the silicon dioxide layers, is provided as a gate insulating film lying directly below the gate electrodes of the first polysilicon layer (poly 1) 105 and the second polysilicon layer (poly 2) 109. The first and second polysilicon layers 105 and 109, forming the first and second gate electrodes, are also termed first and second gate electrodes or the first and second polysilicon gate electrodes.

Figure 18:
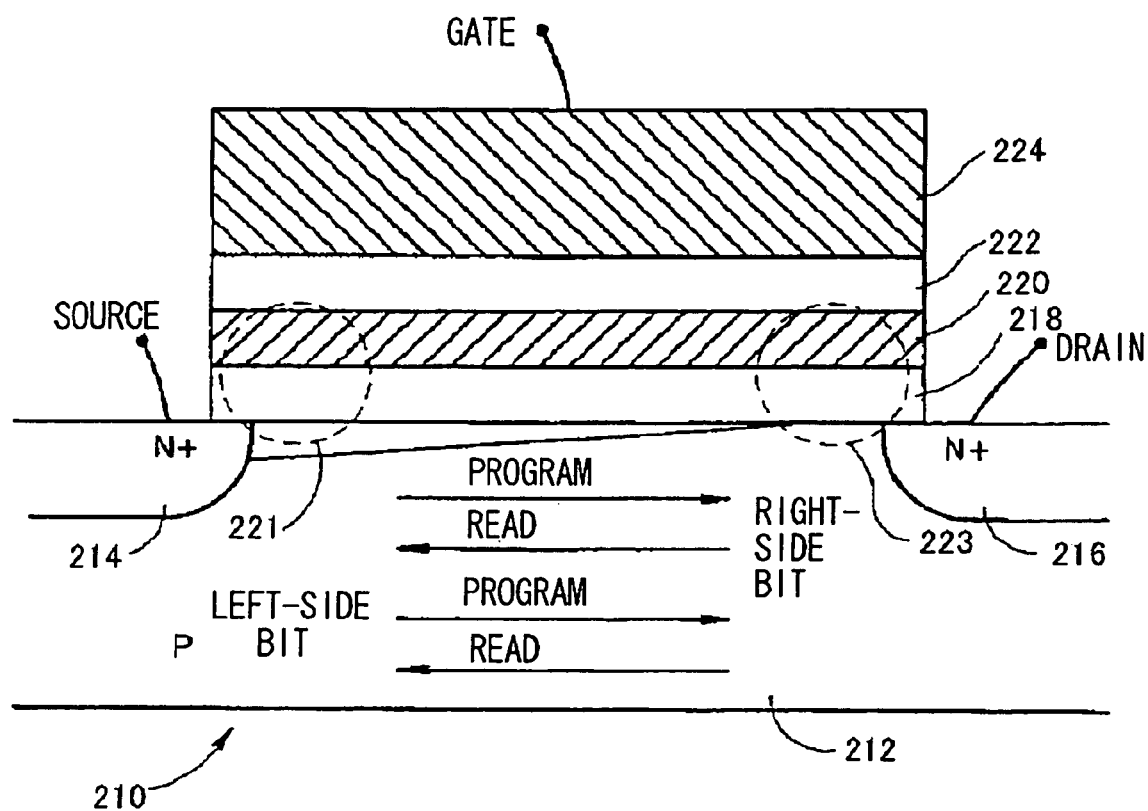
FIG. 18 illustrates a structure of an EEPROM having a charge-trapping layer.

The memory cell formed by the first polysilicon gate electrode (poly 1) 105 and the diffusion regions of the divisions on both sides thereof (regions CT of FIG. 1) and the memory cell formed by the second polysilicon gate electrode (poly 2) 109 and the diffusion regions of the divisions on both sides thereof (regions CT of FIG. 1), are provided with a storage node on each of left and right sides thereof, independently of each other, in the charge trapping layer sandwiched between the silicon dioxide layers lying directly below the gate electrode, as already explained with reference to FIG. 18, such that programming, reading and erasure are carried out by applying the preset voltage to the gate electrode and by applying the preset voltages to the source and drain diffusion regions on both sides of the gate electrode.

FIG. 2 illustrates the correspondence between the memory cell and the storage node. FIG. 2 schematically shows the correspondence between a division $MC_{i,j}$ and storage nodes, in which the division $MC_{i,j}$ is demarcated by two, namely the number i and number i+1, first polysilicon gate electrodes (poly 1) 105 and by two, namely the number j and number j+1, second polysilicon gate electrodes (poly 2) 109, as four sides. Meanwhile, the contact CT, connecting to the diffusion region of the division $MC_{i,j}$ is omitted.

The charge trapping layer directly below the polysilicon gate electrode (poly 1) 105, lying intermediate between the diffusion region in the substrate surface of the division $MC_{i,j}$ and the diffusion region in the substrate surface of the division $MC_{i-1,j}$, has two, namely left and right, storage nodes (1L and 1R). In FIG. 2, the storage node towards a smaller division number on a row or a column with respect to the division $MC_{i,j}$ is termed a left (L) storage node, for convenience sake.

The charge trapping layer directly below the polysilicon gate electrode (poly 2) 109, lying intermediate between the diffusion region in the substrate surface of the division $MC_{i,j}$ and the diffusion region in the substrate surface of the division $MC_{i,j+1}$, has two, namely left and right, storage nodes (2L and 2R). The charge trapping layer directly below the polysilicon gate electrode (poly 1) 105, lying intermediate between the diffusion region in the substrate surface of the division $MC_{i,j}$ and the diffusion region in the substrate surface of the division $MC_{i+1,j}$, has two, namely left and right, storage nodes (3L and 3R). The charge trapping layer directly below the polysilicon gate 109, lying intermediate between the diffusion region in the substrate surface of the division $MC_{i,j}$ and the diffusion region in the substrate surface of the division $MC_{i,j-1}$, has two, namely left and right, storage nodes (4L and 4R). Consequently, each cell or division $MC_{i,j}$ has four storage nodes 1R, 2L, 3L and 4R. In the substrate surface, on which the first polysilicon gate electrode (poly 1) and the second polysilicon gate electrode (poly 2) are overlapped, there are provided P+ regions for device isolation of the respective cell transistors.

In the present embodiment, connection to the metal interconnection 112, forming a bit line, is made with one contact per division, as shown in FIG. 1.

In the present embodiment, one storage bit 1R of a division or cell $MC_{i,j}$ is accessed by applying a preset voltage to the number i first polysilicon layer 105 (word line) and by applying the source voltage or the drain voltage, corresponding to the access, to the metal interconnection 112 (bit line) connecting to the diffusion region of the division $MC_{i,j}$ through the contact and to the metal interconnection 112 (bit line) connecting to the diffusion region of the division $MC_{i-1,j}$ through the contact. A storage bit 2L of a division or a cell $MC_{i,j}$ is accessed by applying a present voltage to the number j+1 second polysilicon layer 109 (word line) and by applying the source voltage or the drain voltage corresponding to the accessed to the metal interconnection 112 (bit line) connecting to the diffusion region of the division $MC_{i,j}$ through the contact and to the metal interconnection 112 (bit line) connecting to the diffusion region of the division $MC_{i,j+1}$ through the contact.

In similar manner, one storage bit 3L of a division or a cell $MC_{i,j}$ is accessed by applying a preset voltage to the number i first polysilicon layer 105 (word line) and by applying the source voltage or the drain voltage corresponding to the access to the metal interconnection 112 (bit line) connecting to the diffusion region of the division $MC_{i,j}$ through the contact and to the metal interconnection 112 (bit line) connecting to the diffusion region of the division $MC_{i+1,j}$ through the contact. A storage bit 4R of a division or a cell $MC_{i,j}$ is accessed by applying a preset voltage to the number j second polysilicon layer 109 (word line) and by applying the source voltage or the drain voltage corresponding to the access to the metal interconnection 112 (bit line) connecting to the diffusion region of the division $MC_{i,j}$ through the contact and to the metal interconnection 112 (bit line) connecting to the diffusion region of the division $MC_{i,j-1}$ through the contact.

The diffusion region (having one contact) of one division $MC_{i,j}$ corresponds to the source or drain diffusion region of a cell transistor composed of the first polysilicon gate 105 and two diffusion regions and to the source or drain diffusion region of a cell transistor composed of the second polysilicon gate 109 and two diffusion regions. In this manner, four storage nodes per one division, having its four sides demarcated by the first polysilicon gate 105 and the second polysilicon gate 109, can be independently accessed. Since one division is associated with one contact, one contact is associated with four bits, so that one bit is associated with ¼ contact.

Figure 3:
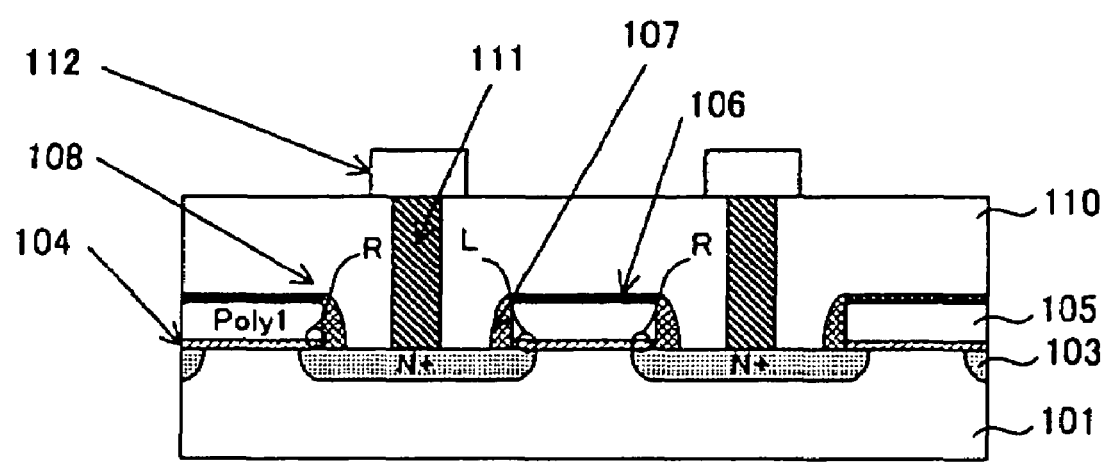
FIG. 3 schematically shows the cross-section taken along line A—A of FIG. 1.
Figure 5:
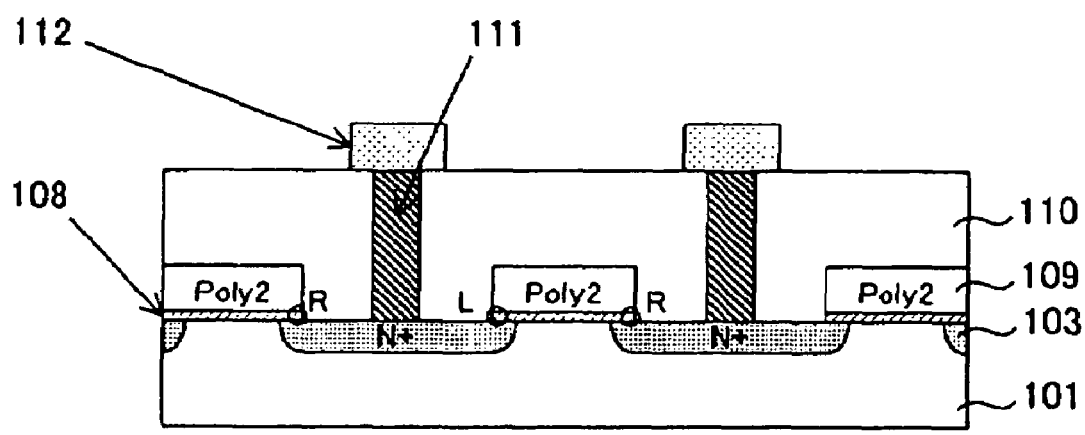
FIG. 5 schematically shows the cross-section taken along line C—C of FIG. 1.

Referring to the drawings, the structure of a memory cell of a semiconductor memory device, according to one embodiment of the present invention, is now explained. FIG. 3 is a schematic view showing the cross-section taken along line A-A' of FIG. 1. FIG. 4 is a schematic view showing the cross-section taken along line B-B' of FIG. 1. FIG. 5 is a schematic view showing the cross-section taken along line C-C' of FIG. 1. FIG. 6 is a schematic view showing the cross-section taken along line D-D' of FIG. 1.

FIG. 3, showing the cross-section taken along line A-A' of FIG. 1, illustrates the cross-section of a memory cell transistor, having a first polysilicon gate electrode 105 as a gate. That is, a contact associated with the contact CT of the division of FIG. 1 is shown. More specifically, referring to FIG. 3, a source drain diffusion region 103 is formed in the substrate surface of a P-type silicon substrate 101, the first polysilicon gate electrode 105 is formed on a first ONO film 104 provided on the P-type silicon substrate 101, and a sidewall 107 is formed on the lateral side of the first polysilicon gate electrode 105. On the surface of the first polysilicon gate electrode 105 is formed an insulating oxide film 106. On an interlayer insulating film(inter-layer dielectrics) 110 is formed a metal interconnection (metal 1) 112 forming a first interconnection layer. The diffusion region 103 and the metal interconnection 112 are interconnected via a contact 111.

Referring to FIG. 4, which shows the cross-section, taken along line B-B' of FIG. 1, there is provided a P+ region 102 in an area in the substrate surface where the second polysilicon gate electrode 109 intersects the P+ region 102. A second ONO film 108 is formed extending along the second polysilicon gate 109 directly below the gate 109. The second ONO film 108 is formed in an intersection of the first polysilicon gate electrode 105 for extending along line B-B' for overlying the insulating oxide film 106 and the sidewall 107 on the surface of the first polysilicon gate electrode 105. The insulating oxide film 106 and the sidewall 107 are provided on the first polysilicon gate 105 and on the sidewall thereof. The second ONO film 108 is provided thereon to assure reliable electrical insulation between the first polysilicon gate 105 and the second polysilicon gate 109. The interlayer insulating film 110 is provided on the second polysilicon gate electrode 109 and the metal interconnection 112 (metal 1) is formed thereon. In the present embodiment, device isolation of the memory cell transistor is achieved by a P+ region 102 in the substrate surface at the intersection of the first and second polysilicon gates 105 and 109.

In FIG. 5, which illustrates a cross-section taken along line C-C' of FIG. 1, there is shown the cross-section of a memory cell transistor having the second polysilicon gate 109 as the gate. More specifically, the cross-section of a memory cell transistor at the point of intersection of the line A-A' and the line C-C' of FIG. 1 is shown in FIG. 5. Referring to FIG. 5, the source drain diffusion region 103 is formed on the surface of the substrate 101, and the second polysilicon gate 109 is formed on the second ONO film 108 provided on the substrate surface. The metal interconnection 112 (metal 1) is formed on the interlayer insulating film 110.

The metal interconnection 112 and the diffusion region 103 are interconnected by the contact 111.

Referring to FIG. 6, which illustrates the cross-section taken along line D-D' corresponding to the longitudinal direction of the first polysilicon gate 105 of FIG. 1, a device isolation region (P+) 102 is provided in the substrate surface at the intersection of the first and second polysilicon gates 105 and 109, the first polysilicon gate electrode 105 is provided on the first ONO film 104, while the second ONO film 108 and the second polysilicon gate electrode 109 are provided on the insulating oxide film 106 on the surface of the first polysilicon gate electrode 105 for extending in a direction perpendicular to the first polysilicon gate electrode 105. The metal interconnection (metal 1) 112 is formed on the first interconnection layer on the interlayer insulating film 110.

Referring to FIG. 3, two spatially spaced apart bits data can independently be stored in the electron trapping film directly below the first polysilicon gate electrode 105, by setting the potential of the diffusion regions 103, forming the source and the drain, to a high potential and to a ground potential, respectively, through two neighboring metal interconnections (metal 1) 112 which are connected by contacts to the source drain diffusion regions 103, and by applying a preset potential to the gate electrode 105. The storage nodes of the two bits are indicated by L and R of the first ONO film 104. Moreover, the two bits indicated by L and R in the second ONO film 108 directly below the second polysilicon gate electrode 109 can independently be stored. Thus, two memory cell transistors (MOSFETs) and four bits of the storage nodes are provided for one contact 111, connected to the diffusion region 103.

In the present embodiment, the current driving capability of the transistors connected to the first polysilicon gate 105 and the second polysilicon gate 109 may be made equivalent by equating the transconductance (β) of the first and second MOS transistors in one memory cell. For example, at least one of the gate length, gate width and the gate insulating film of the first and second MOS transistors may be of a different structure. The channel length (L) of the two MOS transistors in one cell is determined by the line widths of the first and second polysilicon gates 105 and 109, while the channel width (W) having the first polysilicon gate electrode 105 as the gate, is determined by the space of the second polysilicon gate 109. The channel width (W) having the second polysilicon gate 109 as the gate is determined by the space of the first polysilicon gate 105. The transconductance (β) of the MOS transistor is proportionate to W/L and inversely proportionate to the thickness of the gate insulating film.

The read currents among the cells connected to the first and second polysilicon gates 105 and 109 are made constant in this manner by setting the transconductance (β) of the cell transistor, that is the current driving capability, to the same value.

Figure 7:
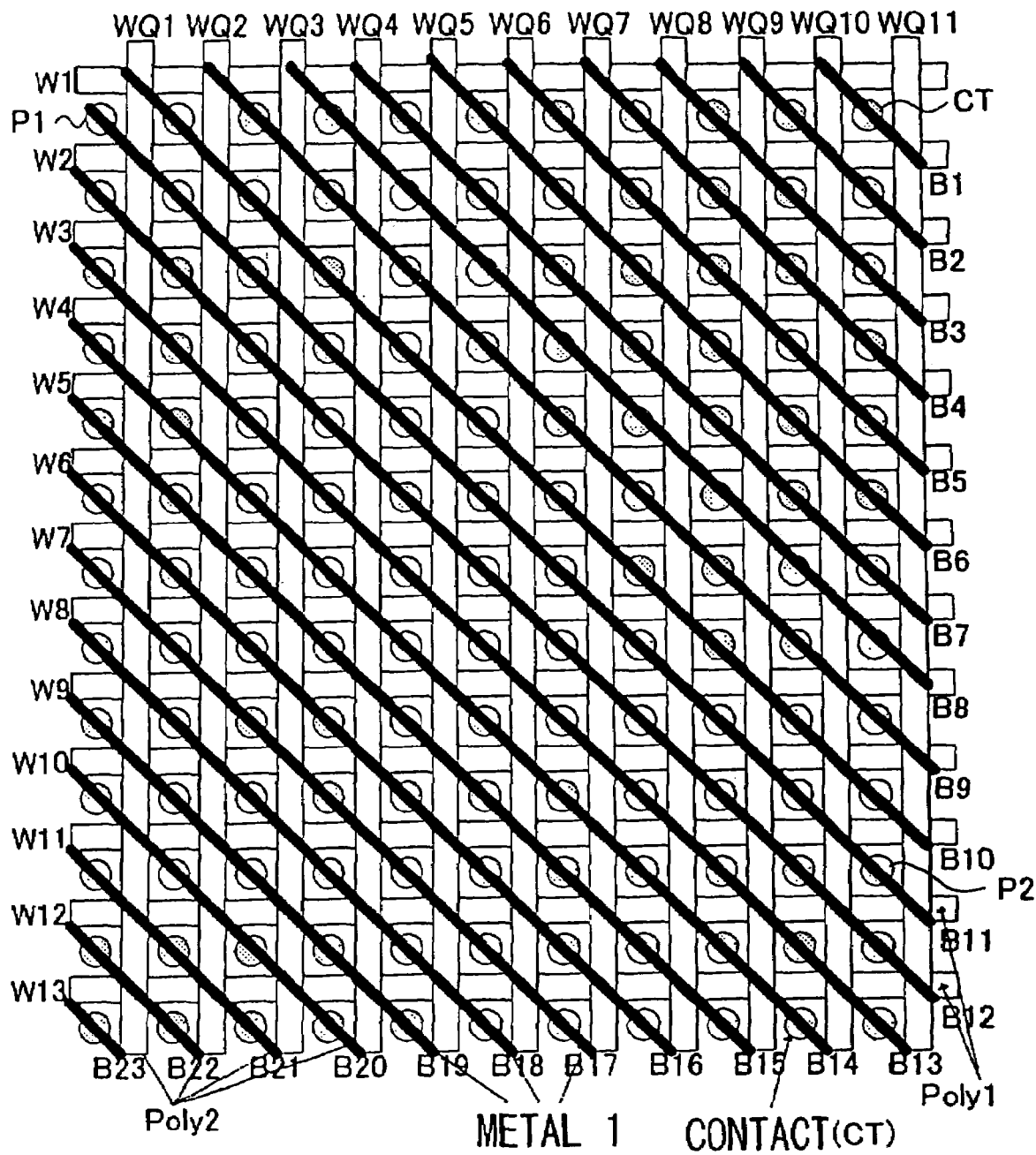
FIG. 7 shows the structure of a memory cell array of an embodiment shown in FIG. 1.

FIG. 7 shows the structure of an embodiment of the present invention and specifically shows the layout structure of the memory cell array corresponding to that of the embodiment shown in FIG. 1. In this embodiment, there are provided a first group of 13 word lines W1 to W13 of first polysilicon (poly 1) and a second group of 11 word lines WQ1 to WQ11 of second polysilicon (poly 2), lying as an upper layer of the first polysilicon (poly 1) at the intersection with the first polysilicon (poly 1), with the total number of the word lines being 24. In each of the diffusion regions of the respective divisions demarcated by the first group of the word lines W1 to W13 and the second group of the word lines WQ1 to WQ11, arranged in a matrix pattern, there is provided one contact (CT). The metal interconnections B1 to B12 and B13 to B23, forming bit lines, are connected via contacts (CT) with the diffusion regions of the divisions demarcated in a matrix-like pattern by the word lines. For example, a metal interconnection (metal 1) B10 is formed in a straight line (diagonal line) interconnecting the division of the intersection between the word lines W1 and WQ1 and division of the intersection between the word lines W11 and WQ11. The remaining metal interconnections are arranged parallel to this diagonal line. Referring to FIG. 7, the first group of the word lines W1 to W13 are drawn out from the left side of the memory cell array, while the second group of the word lines WQ1 to WQ11 are drawn out from the upper side of the memory cell array. The metal interconnections B1 to B12, forming the bit lines, arranged obliquely relative to the lattice formed by the first group of the word lines (first polysilicon: poly1) and the second group of the word lines (second polysilicon: poly 2), are drawn from the right side of the memory cell array, while the metal interconnections B13 to B23 are drawn from the lower side thereof.

The first group of the word lines W1 to W13 are driven from a word line driver, not shown, provided on the left side of the memory cell array, while the second word lines WQ1 to WQ11 are driven from a word line driver, not shown, provided on the upper side thereof. The first group of bit lines B1 to B12 are taken out from the right side of the memory cell array, while the second group of bit lines B13 to B23 are taken out from the lower side thereof. Meanwhile, in FIG. 7, the end division determined by the word lines W13 and WQ1 and the contact of the bit line B23 has a storage node of two bits. The division of the ends determined by the word lines W13 and WQ11 and the contact of the bit line B13, connecting to the bit line B23 by the contact, has a storage node of two bits. The end division demarcated by the word lines W13 and WQ2 to WQ10 has a storage node of three bits.

Figure 11A:
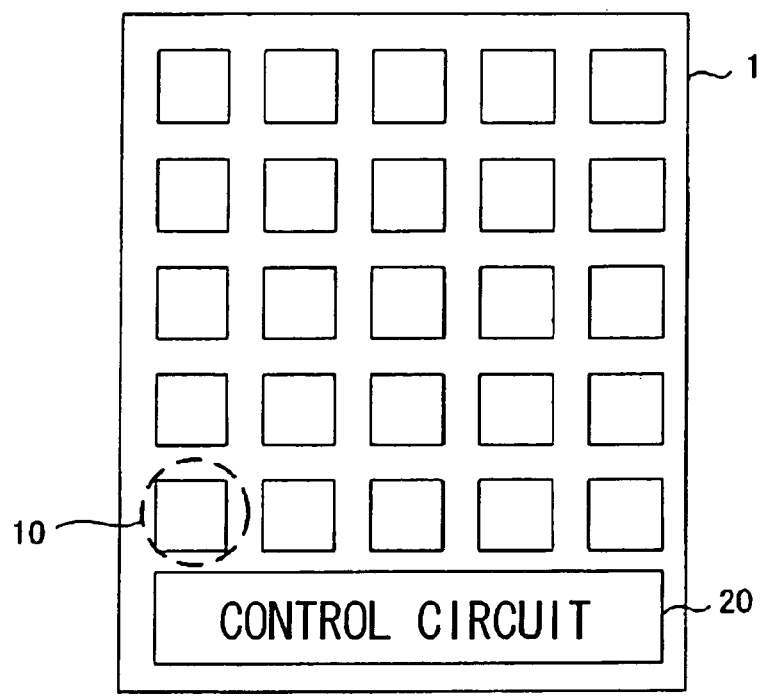
FIGS. 11A, 11B and 11C show overall structures of a semiconductor device according to an embodiment of the present invention.
Figure 11B:
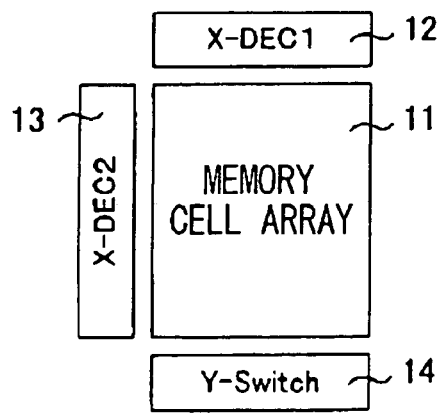
Figure 11C:
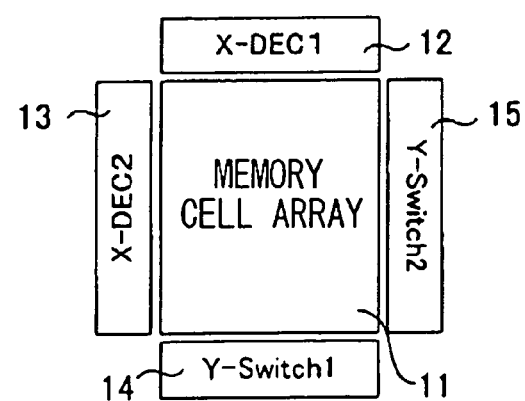

FIG. 11A shows the overall arrangement of the semiconductor memory device of the present embodiment. The semiconductor memory device has plural memory cell array blocks 10 and a control circuit 20 for controlling the program(write), read and erasure operations. FIGS. 11B and 11C show the structure of the block 10 of FIG. 11A.

The memory block of the structure shown in FIG. 7 corresponds to the structure shown in FIG. 11C. First and second X decoders 12 and 13, driving the word lines selected from the first and second groups of the word lines by decoding the row address are provided facing the upper and left sides of the rectangular memory cell array 11. First and second Y decoders 14 and 15, performing the control of decoding the column address and turning on the Y switch of the selected bit lines, are provided facing the lower and right sides.

Figure 8:
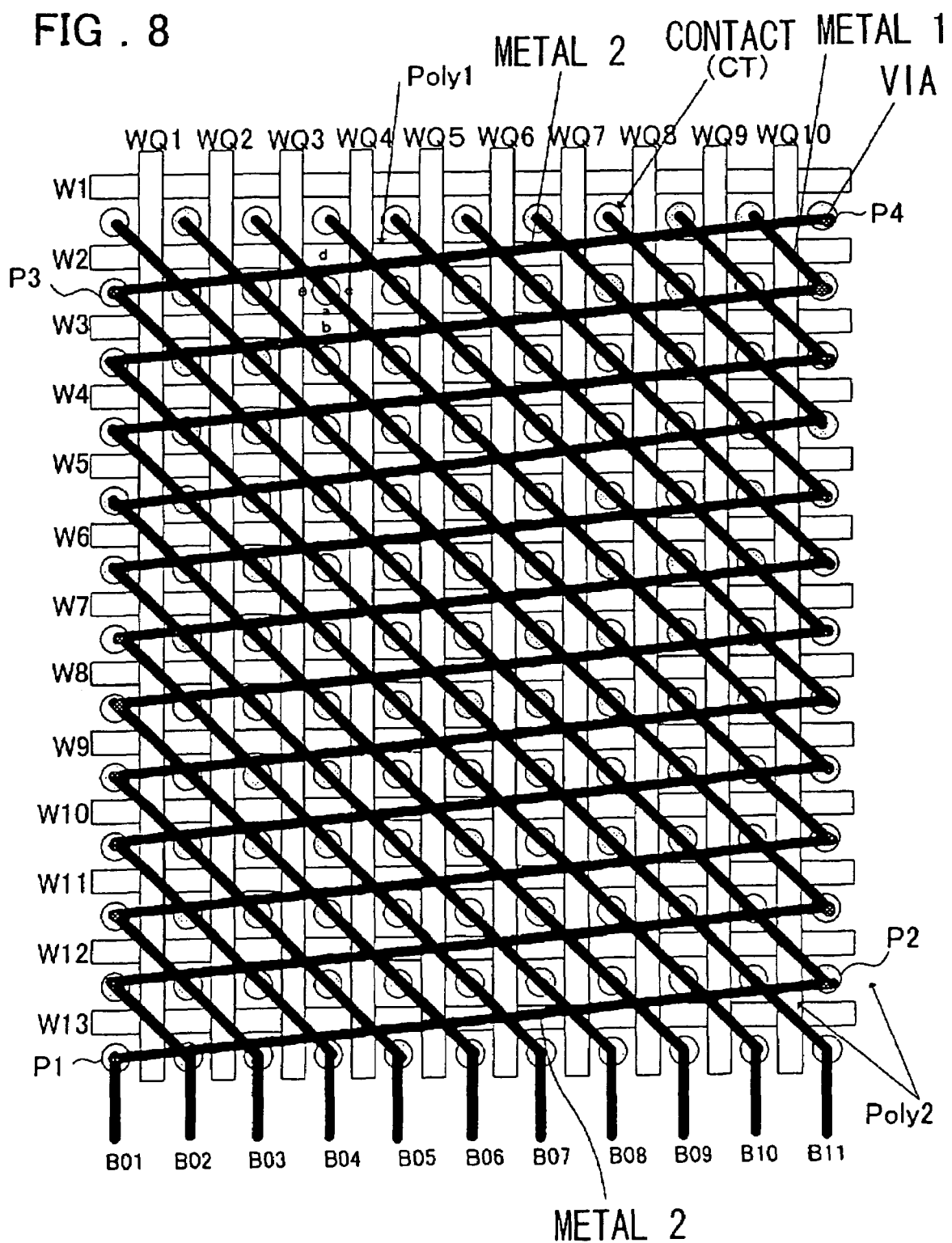
FIG. 8 illustrates the layout structure of a second embodiment of the present invention.

A second embodiment of the present invention is now explained. FIG. 8 shows a layout structure forming a second embodiment of the present invention. In FIG.8, plural metal interconnections (metal 2) extending from the left upper side towards the right lower side in parallel to one another are interconnections of the second interconnection layer, while plural metal interconnections (metal 1) extending from the right upper side towards the left lower side in parallel to one another are interconnections of the first interconnection layer, and are connected to the diffusion regions of the respective divisions via contacts CT. The metal 1 and the metal 2 are made up by, for example, a first aluminum interconnection layer and a second aluminum interconnection layer.

In FIG. 8, the bit line B01 is connected in a division P4 of the right side end to the diffusion region through a via and a contact, traverses the cell array area with a grade separation by the metal interconnection (metal 2) of the second interconnection layer to reach the division P3 on the left side end so as to be connected through a via and a contact to the diffusion region of the division P3. From the division P3 of the left side end, the bit line B01 traverses the cell array area by the metal interconnection of the first interconnection layer (metal 1) to get to the division P2 at the right side end so as to be connected by a contact to the diffusion region. The bit line traverses the cell array area with a grade separation by the metal interconnection (metal 2) of the second interconnection layer to reach the division P1 on the left side end so as to be connected through a via and a contact to the diffusion region.

In the embodiment shown in FIG. 8, 13 divisions or cells are connected to the bit line B01. That is, in the present embodiment, in which the bit lines of the both side ends of the memory cell array are connected through the interconnections of the second interconnection layer (metal 2) to equate the length of each bit line and the number of the memory cells connected to the bit line. Conversely, in the embodiment of FIG. 7, the number of cells connected by the bit lines is not the same.

Moreover, in the present embodiment, in distinction from the embodiment shown in FIG. 7, the bit lines B01 to B11 are drawn out from the lower side of the memory cell array. That is, the memory block having a structure shown in FIG. 8 corresponds to the structure shown in FIG. 11B. That is, first and second X decoders 12 and 13, driving the word lines, selected from the first and second groups of the word lines by decoding the row address, are provided facing the upper and left sides of the rectangular memory cell array 11, while a Y decoder 14 performing the control of decoding the column address and turning on the Y switch of the selected bit lines is provided on the lower side of the memory cell array 11.

In the following, the read, program and erasure operations of the storage node indicated by a reference symbol in the present embodiment shown in FIG. 8 are described.

At the time of reading the storage node a, the word lines W1, W2 and W4 to W13 are at a ground potential, the word line W3=4V, the word lines WQ1 to WQ10 are at the ground potential, bit line B04=1.6V and the bit lines B01 to B03 and B05 to B1 are at ground potential. Under this condition, the potential of the storage node a is read.

At the time of programming the storage node a, the word lines W1, W2 and W4 to W13 are at a ground potential, the word line W3=8V, the word lines WQ1 to WQ10 are at the ground potential, bit line B04=1.6V and the bit lines B01 to B03 and B05 to B11 are at ground potential. Under this condition, electrons are implanted by hot electron implantation in the storage node a.

At the time of erasure, the word lines W1 and W13 are at the ground potential, the word lines WQ1 to WQ10 are at the ground potential, the bit line to be erased, such as B04, is set to 8V and the bit lines not to be erased are set to the ground potential. Under this condition, the storage nodes a, b, c, d and e around the contact connected to the bit line B04 are erased in a lump.

Figure 9:
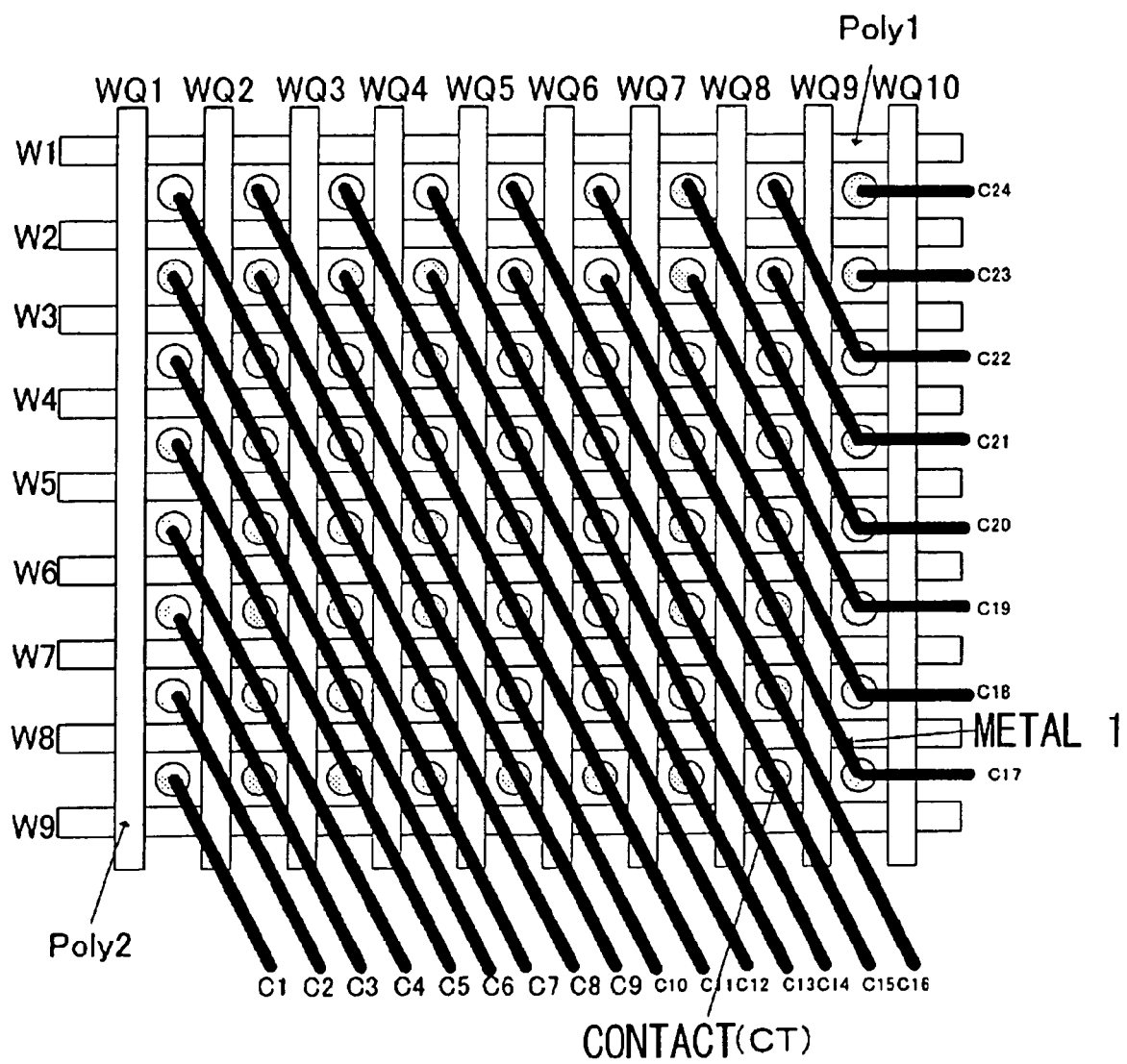
FIG. 9 illustrates the layout structure of a third embodiment of the present invention.

A third embodiment of the present invention is now explained. FIG. 9 shows the layout structure of the third embodiment of the present invention. Referring to FIG. 9, showing the third embodiment, the first group of the word lines (first polysilicon: poly 1) W1 to W9 and the second group of the word lines (second polysilicon: poly 2) WQ1 to WQ10, are arranged in an intersecting relationship and a diffusion region is provided at a division in a substrate surface having the four sides demarcated by the first and second word lines. A metal interconnection (metal 1) is provided obliquely relative to the lattice point defined by the first and second word lines.

Referring to FIG. 9, showing the present embodiment, plural metal interconnections (metal 1), extending obliquely, are advanced by two divisions in the row direction each time the metal interconnections are advanced by one division in the column direction. That is, the plural metal interconnections (metal 1), forming bit lines, are advanced by two divisions in the row direction each time they are advanced by one division in the column direction (keima-skip) and are contact-connected with the respective divisions. In the present embodiment, the bit lines C1 to C16 are drawn out from the lower side of the memory cell array and connected to the respective divisions by the keima skip in the memory cell array. The bit lines C17 to C22 are drawn out from the right side of the memory cell array, while being connected to the respective divisions by the keima skip in the memory cell array. The bit lines C23 and C24 are connected to one division. In the present embodiment, the first and second X decoders and the Y switch selection circuit are arranged as shown in FIG. 11C.

In the present embodiment, the device isolation between the memory cells, connected to the bit lines, is by a field plate method. That is, the device isolation of the cells is by the gate electrodes (insulating films and polysilicon gates) of the respective different layers in the column and row directions. This eliminates the cell-to-cell separation area (102 of FIGS. 4 and 6) on the substrate surface.

However, in the present embodiment, there is imposed a constraint that the pitch between the bit lines becomes severe due to keima-skip interconnections (interconnections at a rate of one word line in the column direction per two word lines in the row direction) of the bit lines (metal 1). For example, referring to FIG. 9, 16 bit lines C1 to C16 of the bit lines (metal 1), arrayed obliquely by keima-skip in the memory cell array, are drawn out on the lower side of the memory cell array, with the bit line density being higher than in the embodiments shown in FIGS. 7 and 8, with the pitch of the bit lines being of a correspondingly reduced value.

Figure 10:
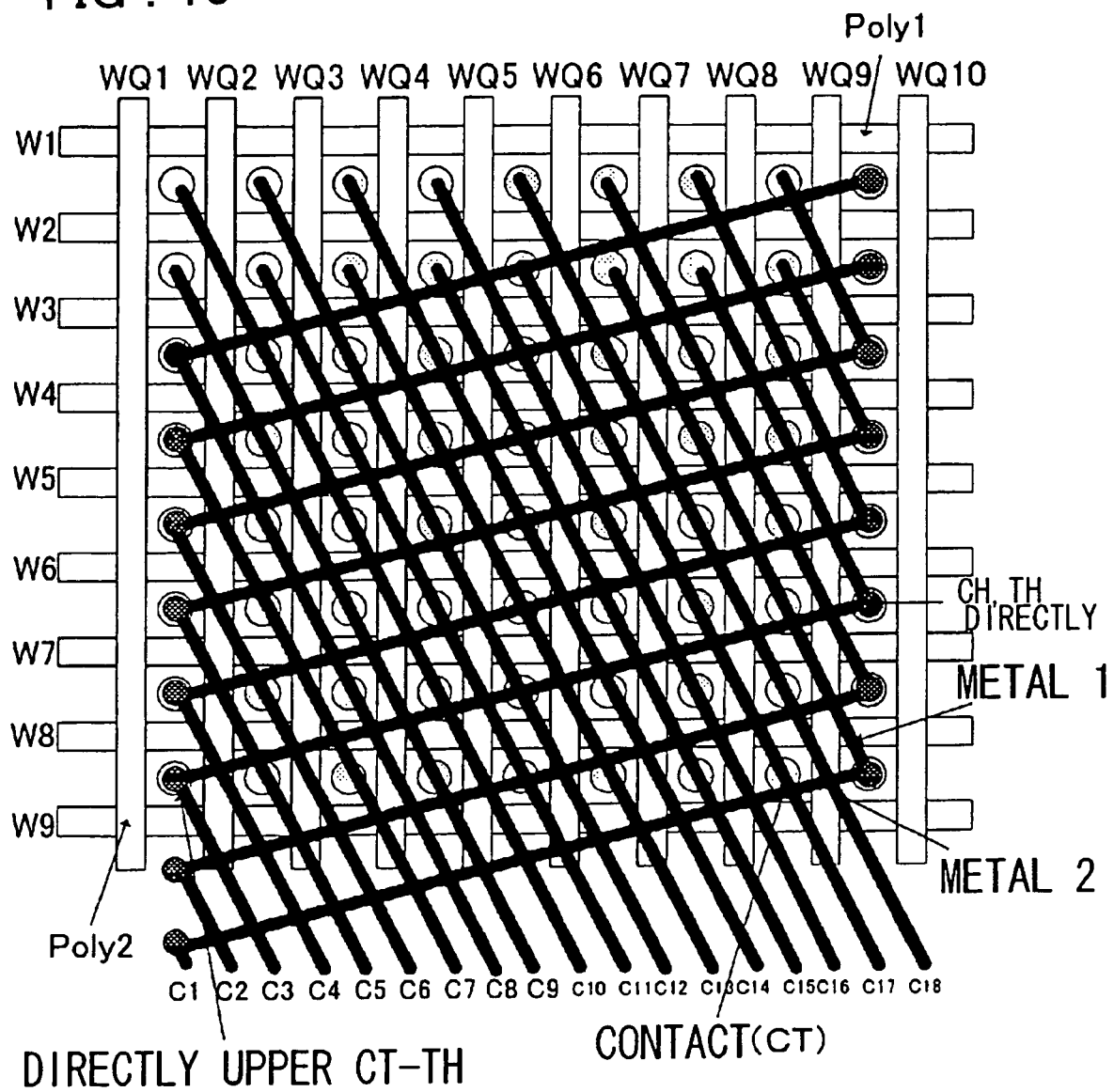
FIG. 10 illustrates the layout structure of a fourth embodiment of the present invention.

A fourth embodiment of the present invention is now explained. FIG. 10 shows the structure of the fourth embodiment of the present invention. The present fourth embodiment corresponds to the embodiment shown in FIG. 9 except that the number of memory cells, connected to the respective bit lines, is the same from one bit line to another. That is, the metal interconnections (metal 2) of the second interconnection layer traverse the memory cell array from the left side to the right side thereof to connect the ends of the metal interconnections (metal 1) of the associated first interconnection layer. That is, in the left side end of the memory cell array and the end of the right side end of the memory cell array (see [CT-TH directly above]), the metal interconnection (metal 2) of the second interconnection layer is connected to the metal interconnection of the first interconnection layer (metal 1) by a through-hole (via) so as to be connected through a contact to the diffusion region of the division. In the present embodiment, the bit lines C1 to C18 are drawn out from the lower side of the memory cell array, with the arrangement of the first and second X decoders and the Y-switch selection circuit being the same as those shown in FIG. 11B.

In the embodiments of FIGS. 8 to 10, the lengths of the first and second polysilicon layers (poly 1, poly 2), forming the first and second groups of the word lines, are set to the same length or to the optional ratio, depending on the size and shape of the memory cell array or on the size of each division (transistor design rule). The numbers of the divisions along the direction of row of the memory cell array and the numbers of the divisions along the direction of column of the memory cell array, in which each division is demarcated in a matrix pattern by the first and second polysilicon layers (poly 1, poly 2), forming the first and second groups of the word lines, are also suitably set to the same or different values.

Figure 12A:
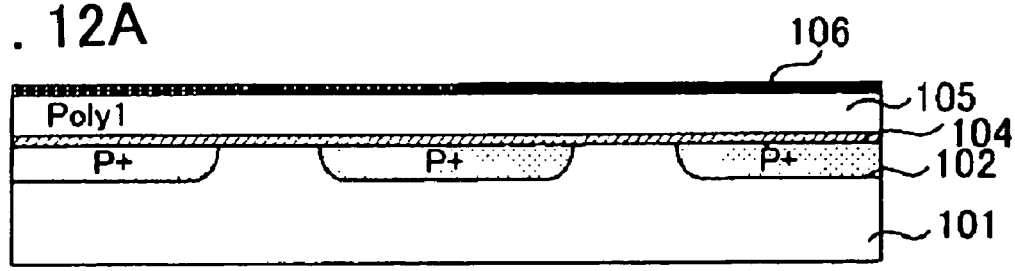
FIGS. 12A, 12B and 12C are cross-sectional views for illustrating a manufacturing method of an embodiment of the present invention, step-by-step.

The manufacturing method of the semiconductor memory device according to one embodiment of the present invention is now explained. FIGS. 12 and 13 show the essential portions of an embodiment of the manufacturing method of the present invention, step-by-step.

First, P-wells 102 are formed in the memory cell area of a P-type silicon substrate 101. That is, a P+ region is formed in a region destined to be a device isolation region, by ion implantation, using a mask. This step may be omitted depending on the concentration of the P-well. The first ONO film 104 is then deposited on the entire substrate surface. Then, a first polysilicon layer (poly 1) 105 and an insulation oxide film 106, with a film thickness of approximately 100 nm, are deposited in this order (see FIG. 12A).

Figure 12B:
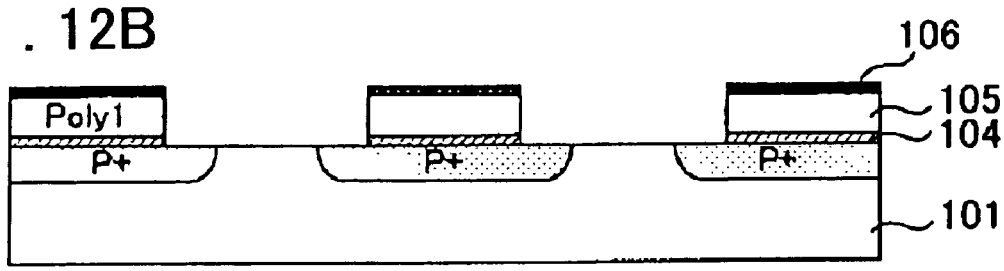
Figure 12C:
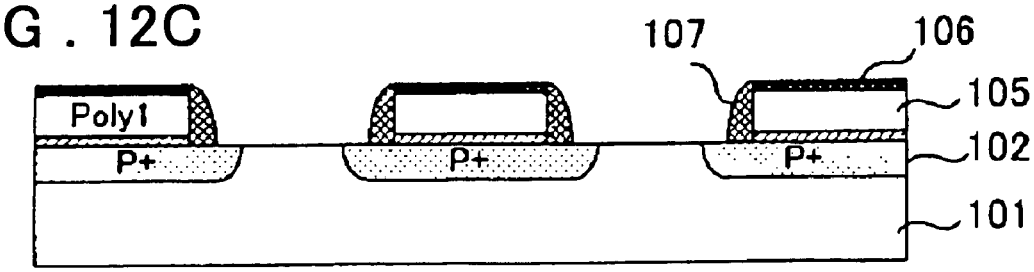

A gate electrode structure is formed by etching to a preset shape, that is, to a stripe shape extending in one direction, using the insulation oxide film 106 and the first polysilicon layer 105 as a mask (see FIG. 12B).

An oxide film with a film thickness of approximately 100 nm, then is formed on the entire surface and etchback is carried out. On a substrate portion where the first polysilicon layer 105 is not formed, the first ONO film 104 is etched so that the surface of the silicon substrate 101 is exposed. The first polysilicon layer 105 is etched so that preferably the insulating oxide film 106 is left to a thickness of the order of 50 nm. As a result, a sidewall 107 (sidewall of the insulating film) of the order of 80 nm is formed on the lateral side of the first polysilicon layer 105 (see FIG. 12C).

Figure 13A:
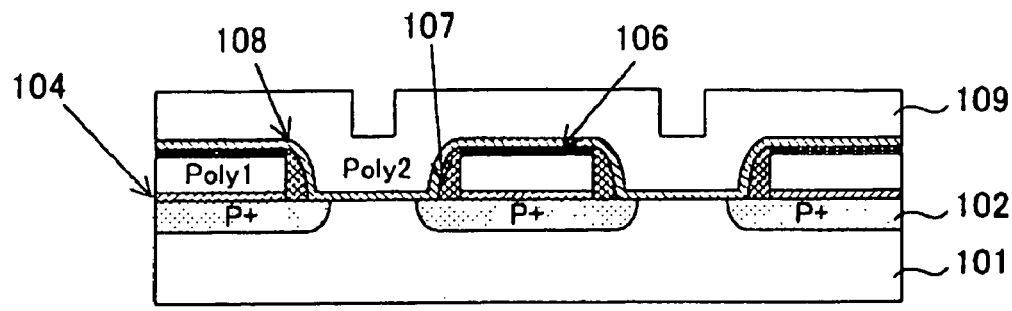
FIGS. 13A, 13B, 13C and 13D are cross-sectional views for illustrating a manufacturing method of an embodiment of the present invention, step-by-step.
Figure 13B:
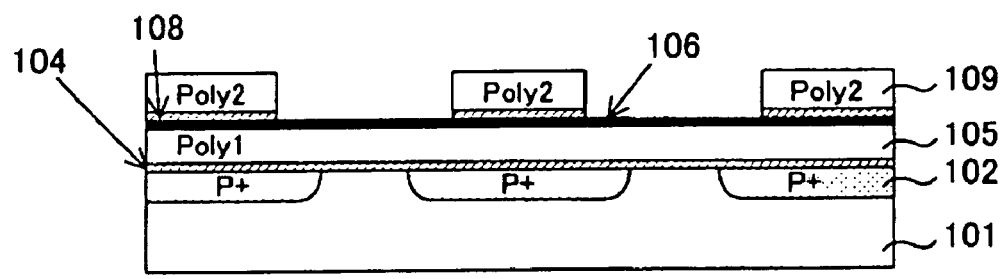

A second ONO film 108 and a second polysilicon layer 109 (poly 2) are then sequentially formed on the entire surface. The second polysilicon layer 109 then is etched, using a mask, so that the second polysilicon layer 109 extends in a striped pattern in a direction perpendicular to the first polysilicon layer 105 (see FIGS. 13A and 13B). FIGS. 13A and 13B correspond to the cross-section along lines B-B' and D-D' of FIG. 1.

The sidewall 107 on the lateral side of the first polysilicon layer 105, not covered by the second polysilicon layer 109, is removed by dry etching.

Figure 13C:
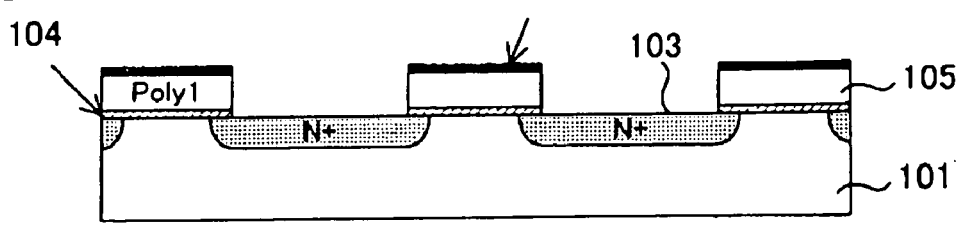
Figure 13D:
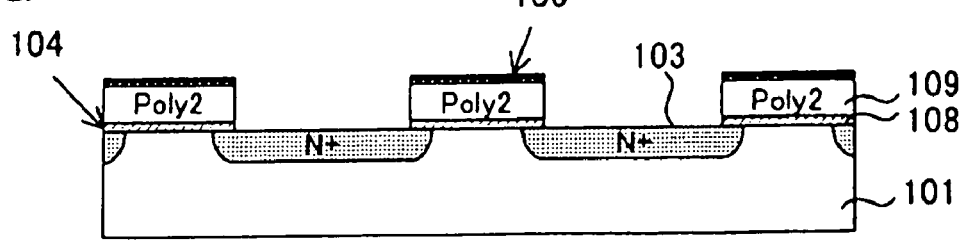

N-type impurity ions are then implanted on the entire surface to form an N+ layer 103 on the surface of the silicon substrate 101 where the first and second polysilicon layers are present (see FIGS. 13C and 13D).

The interlayer insulating film 110 then is formed, as shown for example in FIG. 3, and a contact hole is then formed, using a mask, for electrical connection to the N+ layer 103 of the lattice pattern. A metallic material then is embedded in the contact hole.

A metal film then is deposited and the metal interconnection (metal 1) 112 is formed by patterning so that the metal interconnection is arranged obliquely relative to the lattice points formed by the first and second polysilicon layers 105 and 109.

A further embodiment of the manufacturing method for the memory according to the present invention is explained. FIGS. 14 to 17 depict cross-sections taken along lines A-A', B-B', C-C' and D-D' of FIG. 1, respectively. This embodiment includes a device isolation region within the substrate.

The first ONO film 104 is deposited on the entire substrate surface, in the same way as in the manufacturing method of the previous embodiment. The first polysilicon layer 105 and the insulating oxide film 106 (with a film thickness of the order of 100 nm) are then formed in this order.

A gate electrode structure is formed by etching to a preset shape (striped shape extending in one direction), using the insulating oxide film 106 and the first polysilicon layer 105 as a mask.

An oxide film then is formed on the entire surface and etchback is carried out. On a substrate portion where the first polysilicon layer 105 is not formed, the first ONO film 104 is etched to expose the silicon substrate 101. The first polysilicon layer 105 is etched so that preferably the insulating oxide film 106 is left to a thickness of the order of 50 nm. As a result, a sidewall 107 of the order of 80 nm is formed on the lateral side of the first polysilicon layer 105.

A second ONO film 108 and a second polysilicon layer 109 are then sequentially formed on the entire surface. The second polysilicon layer 109 then is etched, using a mask, so that the second polysilicon layer 109 extends in a striped pattern in a direction perpendicular to the first polysilicon layer 105. Up to this step, the manufacturing process is similar to that explained with reference to FIGS. 12 and 13. The present embodiment differs from the previous embodiment as to the next step.

For forming a device isolating region in a region where the first polysilicon layer 105 is overlapped with the second polysilicon layer 109, boron ions (B+), for example, are implanted at an energy of implantation sufficient to permit the ions to penetrate through the first polysilicon layer 105 and the second polysilicon layer 109. The boron ions (B+) are introduced to the region of the substrate surface where the first polysilicon layer 105 is overlapped with the second polysilicon layer 109, a diffusion region forming region where neither the first polysilicon layer 105 nor the second polysilicon layer 109 is present, and to a deep site in the channel region of the silicon substrate 101. The device isolating region 102 may be formed in self-alignment on the substrate surface region where the first polysilicon layer 105 is overlapped with the second polysilicon layer 109, and in a deep region in the bulk of the substrate below the diffusion region and below the channel region.

Then, N-type impurities are implanted to the entire surface, in the same way as in the previous embodiment, to form the N+ layer 103 on the silicon substrate surface region where neither the first polysilicon layer nor the second polysilicon layer is present. The interlayer insulating film 110 then is formed. A contact hole then is bored for electrical interconnection to the lattice-shaped N+ layer 103, using a mask, and a metal material is then buried in the contact hole to form the contact 111.

The metal interconnection 112 then is formed by patterning so as to be positioned obliquely relative to the lattice of the first and second polysilicon layers 105 and 109.

Although the present invention has been described with reference to the preferred embodiments thereof, the present invention is not limited to these embodiments described and may comprise variegated modifications and corrections as may readily occur to those ordinarily skilled in the art within the scope of the invention as defined in the appended claims. For example, the gate electrode material is not limited to polysilicon and may also be high melting metals or their silicides. The metal interconnection, forming bit lines, is not limited to aluminum interconnections. The charge trapping layer is not limited to the silicon nitride film sandwiched between the silicon dioxide layers but may also be a known type of the charge trapping layer, such as silicon dioxide layer, doped with impurities.

The meritorious effects of the present invention are summarized as follows.

According to the present invention, described above, the semiconductor memory device, having a charge trapping layer in the gate structure, is provided, in which the four sides of the diffusion region, connected via a contact to the obliquely extending bit lines, are surrounded by first and second gate electrodes, to provide a structure in which four bits are stored per contact (¼ contacts per bit) whereby a high density may be achieved by a simplified structure as plural bits are stored per cell.

Moreover, according to the present invention, a bit line is connected to the interconnection via a through-hole in a region on an end on one side of the cell array to a region on an end of the opposite side, such that, as the lengths of the bit lines arranged obliquely and the number of the cells to be connected remain equal to one another, the resistance or the capacitance of the bit lines are rendered equal to one another.

Moreover, according to the present invention, the different cells are isolated from one another by the gate electrodes of the layers different in the column and row directions, whereby the device isolation region by LOCOS (local oxidation of silicon) or PN junctions is not needed.

According to the manufacturing method of the present invention, a high density may be achieved by a simplified structure as plural bits are stored per cell.

In addition, according to the present invention, the device isolation area is formed by ion implantation by self-alignment in the overlapping regions of the first and second gate electrodes, after the formation of the first and second gate electrodes, thus assuring more reliable device isolation.

It should be noted that other objects, features and aspects of the present invention will become apparent in the entire disclosure and that modifications may be done without departing from the gist and scope of the present invention as disclosed herein and claimed as appended herewith.

Also it should be noted that any combination of the disclosed and/or claimed elements, matters and/or items may fall under the modifications aforementioned.

The invention claimed is:

1. A method of manufacturing a semiconductor memory device, comprising:
   (a) a step of depositing a first gate insulating film including a charge trapping layer on a substrate, then depositing a first electrically conductive film on said first gate insulating film, and then depositing an insulating film on said first electrically conductive film to form a stripe-shaped first gate electrode structure;
   (b) a step of depositing a second gate insulating film including a charge trapping layer on the entire substrate, with said first gate insulating film which covers said first gate electrode left, and depositing a second electrically conductive film on said second gate insulating film to form a second gate electrode structure extending in a striped pattern in a direction perpendicular to the direction of extension of said first gate electrode;
   (c) a step of implanting impurity ions to form a diffusion region of impurities on a portion of the substrate surface where there lack said first and second electrically conductive films; and
   (d) a step of forming an interlayer insulating film and forming a contact for electrical connection to said impurity diffusion region; and
   (e) a step of forming an electrically conductive interconnection, connecting to said diffusion region via said contact, on said inter-layer insulating film.

2. The method as defined in claim 1, wherein said charge trapping layer is a silicon nitride film.

3. The method as defined in claim 1, further comprising, previous to said step (a), a step of forming an impurity diffusion region for device isolation on a portion of the substrate surface directly below an area of intersection of said first gate electrode and the second gate electrode.

4. A method of manufacturing a semiconductor memory device, comprising:
   (a) a step of depositing a silicon dioxide layer on a substrate, then depositing a charge trapping layer on said silicon dioxide and depositing then a silicon dioxide layer on said charge trapping layer to form a first gate insulating film;
   (b) a step of depositing a first electrically conductive film and then depositing an insulating oxide film on said first electrically conductive film to form a stripe-shaped first gate electrode structure;
   (c) a step of depositing an oxide film on the substrate surface and a sidewall on the lateral side of said first gate electrode by etchback;
   (d) a step of depositing a silicon dioxide layer covering the substrate, then depositing a charge trapping layer on said silicon dioxide layer and then depositing a silicon dioxide layer on the charge trapping layer to form a second gate insulating film;
   (e) a step of depositing a second electrically conductive film on the substrate and depositing a stripe-shaped second gate electrode structure extending in a direction perpendicular to the direction of extension of said first gate electrode; and
   (f) a step of implanting impurity ions to form an impurity diffusion region in a portion of the substrate surface devoid of said first and second electrically conductive films.

5. The method as defined in claim 4, further comprising:
   (g) a step of forming, after depositing the interlayer insulating film, a contact for electrically connecting to said impurity diffusion region; and
   (h) a step of forming, on said interlayer insulating film, an electrically conductive interconnection, connecting via said contact to said diffusion region, for extending obliquely relative to the lattice composed by said first and second electrically conductive films.

6. The method as defined in claim 4, wherein said charge trapping layer is a silicon nitride film.

7. The method as defined in claim 4, further comprising, previous to said step (a), a step of forming an impurity diffusion region for device isolation on a portion of the substrate surface directly below an area of intersection of said first gate electrode and the second gate electrode.

8. The method as defined in claim 4, further comprising, subsequent to said step (e) and previous to said step (f), a step of implanting ions of the opposite conductivity type to said diffusion region into the substrate for forming an impurity diffusion region for device isolation in said substrate with an implantation energy sufficient to cause the ions to traverse the first and second gate electrodes superposed together.

9. The method as defined in claim 8, wherein a region containing impurities of an opposite conductivity type to that of said diffusion region to a concentration higher than the concentration of substrate impurities is provided on a substrate surface directly below an intersection between said first gate electrode and said second gate electrode and in a deeper region in the bulk of a substrate below said channel region and said diffusion region, said region being a device isolation region.

* * * * *